United States Patent
Chen (10) Patent No.: US 11,561,261 B2
(45) Date of Patent: Jan. 24, 2023

(54) DEVICE AND METHOD FOR DETECTING SECONDARY BATTERY OF UNINTERRUPTIBLE POWER SYSTEM

(71) Applicant: Fu-Chieh Chen, Taichung (TW)

(72) Inventor: Fu-Chieh Chen, Taichung (TW)

( * ) Notice: Subject to any disclaimer, the term of this patent is extended or adjusted under 35 U.S.C. 154(b) by 99 days.

(21) Appl. No.: 17/189,269

(22) Filed: Mar. 2, 2021

(65) Prior Publication Data

US 2021/0286019 A1 Sep. 16, 2021

(51) Int. Cl.
| | |
|---|---|
| G01R 31/00 | (2006.01) |
| G01R 31/396 | (2019.01) |
| G01R 31/371 | (2019.01) |
| H02J 9/06 | (2006.01) |
| H04L 67/10 | (2022.01) |

(52) U.S. Cl.
CPC ......... *G01R 31/396* (2019.01); *G01R 31/371* (2019.01); *H02J 9/06* (2013.01); *H04L 67/10* (2013.01)

(58) Field of Classification Search
USPC .......................................... 324/426, 430–435
See application file for complete search history.

(56) References Cited

U.S. PATENT DOCUMENTS

| | | | |
|---|---|---|---|
| 10,367,358 B2 | 7/2019 | Chen | |
| 2019/0245357 A1* | 8/2019 | Yang | ........................ H02J 7/34 |
| 2021/0039595 A1* | 2/2021 | Kitamura | ................ B60L 53/68 |

FOREIGN PATENT DOCUMENTS

| | | |
|---|---|---|
| CN | 103713263 A | 1/2014 |
| CN | 109001640 A | 12/2016 |
| CN | 106603874 A | 4/2017 |
| TW | 201828564 A | 8/2018 |

\* cited by examiner

*Primary Examiner* — Vincent Q Nguyen (57) ABSTRACT

A device for detecting a secondary battery of an uninterruptible power system contains: a main battery module and at least one sub battery module. The main battery module includes a first power storage unit, a first detection unit, a first processing unit, a communication unit, and a first data transmission unit. The first power storage unit includes multiple first battery assemblies connected in series, and a respective first battery assembly has at least one secondary battery. The first detection unit includes multiple first detectors. The first data transmission unit includes a first one-way transmit port and a first two-way transmit port. The sub battery module includes a second power storage unit, a second detection unit, a second processing unit, and a second data transmission unit. The second power storage unit includes multiple second battery assemblies connected in series. The second detection unit includes multiple second detectors.

8 Claims, 5 Drawing Sheets

DEVICE AND METHOD FOR DETECTING SECONDARY BATTERY OF UNINTERRUPTIBLE POWER SYSTEM

FIELD OF THE INVENTION

The present invention relates to an uninterruptible power system (UPS), and more particularly to a device and a method for detecting a secondary battery of the UPS.

BACKGROUND OF THE INVENTION

Uninterruptible power systems (UPS) are widely used in various fields such as mobile phone base stations, ATM automatic teller machines, medical life-sustaining equipment or monitoring equipment. The UPS is comprised of at least one secondary battery so as to supply power to a variety of equipment, when mains network is failed, thus avoiding damage or loss because of power failure.

However, it is not easy to maintain the at least one secondary battery of the UPS usually to cause the USP cannot work when the power failure happens. For example, the mobile phone base stations are arranged everywhere, and it is difficult to deploy corresponding maintenance personnel near each base station. Once a certain base station has a power failure and the UPS of the base station cannot supply power, maintenance teams in various regions send personnel for maintenance, and the journey is time-consuming, which makes it difficult to resolve base station communication interruptions as quickly as possible.

In order to avoid the occurrence of the aforementioned problem, maintenance personnel can be dispatched to various equipment locations equipped with the UPS on a regular or irregular basis. Batteries are tested and replaced with weak or damaged secondary batteries based on the test results. However, this inspection mode consumes a lot of maintenance labor.

The present invention has arisen to mitigate and/or obviate the afore-described disadvantages.

SUMMARY OF THE INVENTION

The primary objective of the present invention is to a device and method for detecting a secondary battery of an uninterruptible power system which is capable of detecting the secondary battery automatically and sends detecting result to a cloud server so as to enhance testing and maintaining convenience of the uninterruptible power system.

To obtain above-mentioned objective, a device for detecting a secondary battery of an uninterruptible power system provided by the present invention contains: a main battery module and at least one sub battery module.

The main battery module is coupled with the at least one sub battery module so that the at least one sub battery module sends second-battery data of the at least one sub battery module to the main battery module, and the main battery module sends the second-battery data and first-battery data of the main battery module to a cloud server, such that a remote management module detects the main battery module and the at least one sub battery module remotely.

The main battery module includes a first power storage unit, a first detection unit, a first processing unit, a communication unit, and a first data transmission unit, wherein the first power storage unit is coupled with the first detection unit, the first detection unit, the communication unit and the first data transmission unit are coupled with the first processing unit, wherein the first data transmission unit is coupled with the communication unit.

The first power storage unit includes multiple first battery assemblies which are connected in series, and a respective first battery assembly has at least one secondary battery configured to store and output electric energy.

The first detection unit includes multiple first detectors, and a respective first detector is configured to detect a first voltage value and a first resistance value of the respective first battery assembly and a first temperature value of the first power storage unit, and the respective first detector is configured to send the first voltage value, the first resistance value, and the first temperature value to the first processing unit.

The first processing unit is a microprocessor and is configured to bind the first voltage value and the first resistance value with a corresponding identification code of the respective first battery assembly, and the first processing unit is configured to bind the first temperature value with a corresponding identification code of the first power storage unit, such that the first-battery data are processed and sent to the communication unit.

The communication unit is a wireless communicator configured to send the first-battery data to the cloud server.

The first data transmission unit includes a first one-way transmit port and a first two-way transmit port.

The sub battery module includes a second power storage unit, a second detection unit, a second processing unit, and a second data transmission unit, wherein the second power storage unit is coupled with the second detection unit, the second detection unit is coupled with the second data transmission unit, and the second data transmission unit is coupled with the second processing unit.

The second power storage unit includes multiple second battery assemblies which are connected in series, and a respective second battery assembly has at least one secondary battery configured to store and output electric energy.

The second detection unit includes multiple second detectors, a respective second detector is configured to detect a second voltage value and a second resistance value of the respective second battery assembly and a second temperature value of the second power storage unit, and the respective second detector is configured to send the second voltage value, the second resistance value, and the second temperature value to the second processing unit.

The second processing unit is a microprocessor and is configured to bind the second voltage value and the second resistance value with a corresponding identification code of the respective second battery assembly, and the second processing unit is configured to bind the second temperature value with a corresponding identification code of the second power storage unit, such that the second-battery data are processed and sent to the second communication unit.

The first one-way transmit port is connected with the second two-way transmit port via a transmission wire so that the sub battery module sends the second-battery data to the main battery module via the transmission wire.

Thereby, the first detection unit detects the first power storage unit, the second detection unit detects the second power storage unit, and the communication unit sends the first-battery data and the second-battery data to the cloud server so as to enhance the testing and maintaining convenience.

DETAILED DESCRIPTION OF THE PREFERRED EMBODIMENTS

With reference to FIGS. 1-4, a device for detecting a secondary battery of an uninterruptible power system 100 according to a first embodiment of the present invention, the uninterruptible power system 100 comprises: a main battery module 10 and at least one sub battery module 20, wherein the main battery module 10 is coupled with the at least one sub battery module 20 via a transmission wire 30 so that the at least one sub battery module 20 sends second-battery data of the at least one sub battery module 20 to the main battery module 10, and the main battery module 10 sends the second-battery data and first-battery data of the main battery module 10 to a cloud server 200, such that a remote management module 300 detects the main battery module 10 and the at least one sub battery module 20 remotely, wherein the remote management module 300 is any one of a computer, a tablet computer, and a smart phone and is configured to receive data from the cloud server 200.

Figure 2:
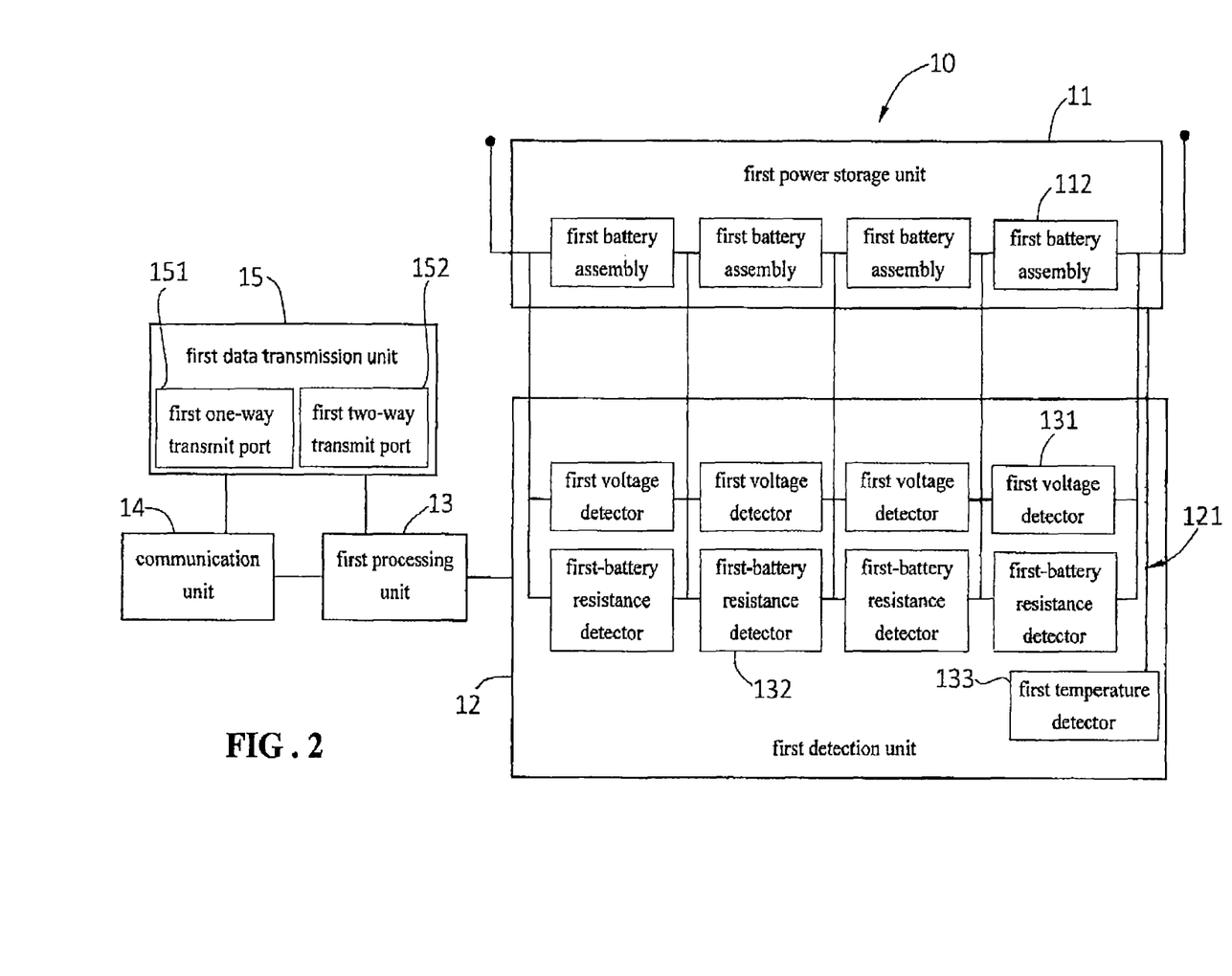
FIG. 2 is a circuit block diagram of the main battery module according to the first embodiment of the present invention.

The main battery module 10 includes a first power storage unit 11, a first detection unit 12, a first processing unit 13, a communication unit 14, and a first data transmission unit 15, wherein the first power storage unit 11 is coupled with the first detection unit 12. The first detection unit 12, the communication unit 14, and the first data transmission unit 15 are coupled with the first processing unit 13, wherein the first data transmission unit 15 is coupled with the communication unit 14.

The first power storage unit 11 includes multiple first battery assemblies 112 which are connected in series, a respective first battery assembly 112 has at least one secondary battery configured to store and output electric energy, and the first power storage unit 11 allocates at least one first identification code in advance, the respective first battery assembly 112 has at least one second identification code allocated thereto, such that the at least one first and second identification codes of the first power storage unit 11 and the respective first battery assembly 112 are distinguished, wherein the respective first battery assembly 112 has multiple battery cores (not shown) which are connected in series.

The first detection unit 12 includes multiple first detectors 121, wherein a respective first detector 121 is configured to detect a first voltage value and a first resistance value of the respective first battery assembly 112 and a first temperature value of the first power storage unit 11, and the respective first detector 121 is configured to send the first voltage value, the first resistance value, and the first temperature value to the first processing unit 13. The multiple first detectors 121 are comprised of multiple first voltage detectors 131, multiple first-battery resistance detectors 132, and a first temperature detector 133, wherein a respective first voltage detector 131 is coupled with the respective first battery assembly 112 so as to detect the first voltage value of the respective first battery assemblies 112, a respective first-battery resistance detector 132 is coupled with the respective first battery assembly 112 so as to detect the first resistance value of the respective first battery assembly 112, and the first temperature detector 133 is coupled with the first power storage unit 11 so as to detect the first temperature value of the first power storage unit 11.

The first processing unit 13 is a microprocessor and is configured to bind the first voltage value and the first resistance value with a corresponding identification code of the respective first battery assembly 112, and the first processing unit 13 is configured to bind the first temperature value with a corresponding identification code of the first power storage unit 11, such that the first-battery data are processed and sent to the communication unit 14. Thereby, the remote management module 300 judges the first-battery data and corresponds the first voltage value and the first resistance value to a specific first battery assembly 112, and the remote management module 300 corresponds the first temperature to the first power storage unit 11, thus distinguishing an operation status of the respective first battery assembly 112 and the first power storage unit 11.

The communication unit 14 is a wireless communicator configured to send the first-battery data to the cloud server 200, wherein the communication unit 14 is at least one of a Narrowband Internet of Thing (NB-IoT) communicator, a 4G/5G wireless communicator, and a 5G wireless communicator.

The first data transmission unit 15 includes a first one-way transmit port 151 and a first two-way transmit port 152, wherein the first one-way transmit port 151 is connected with the transmission wire 30 so as to receive the second-battery data from the sub battery module 20 via the transmission wire 30.

Figure 3:
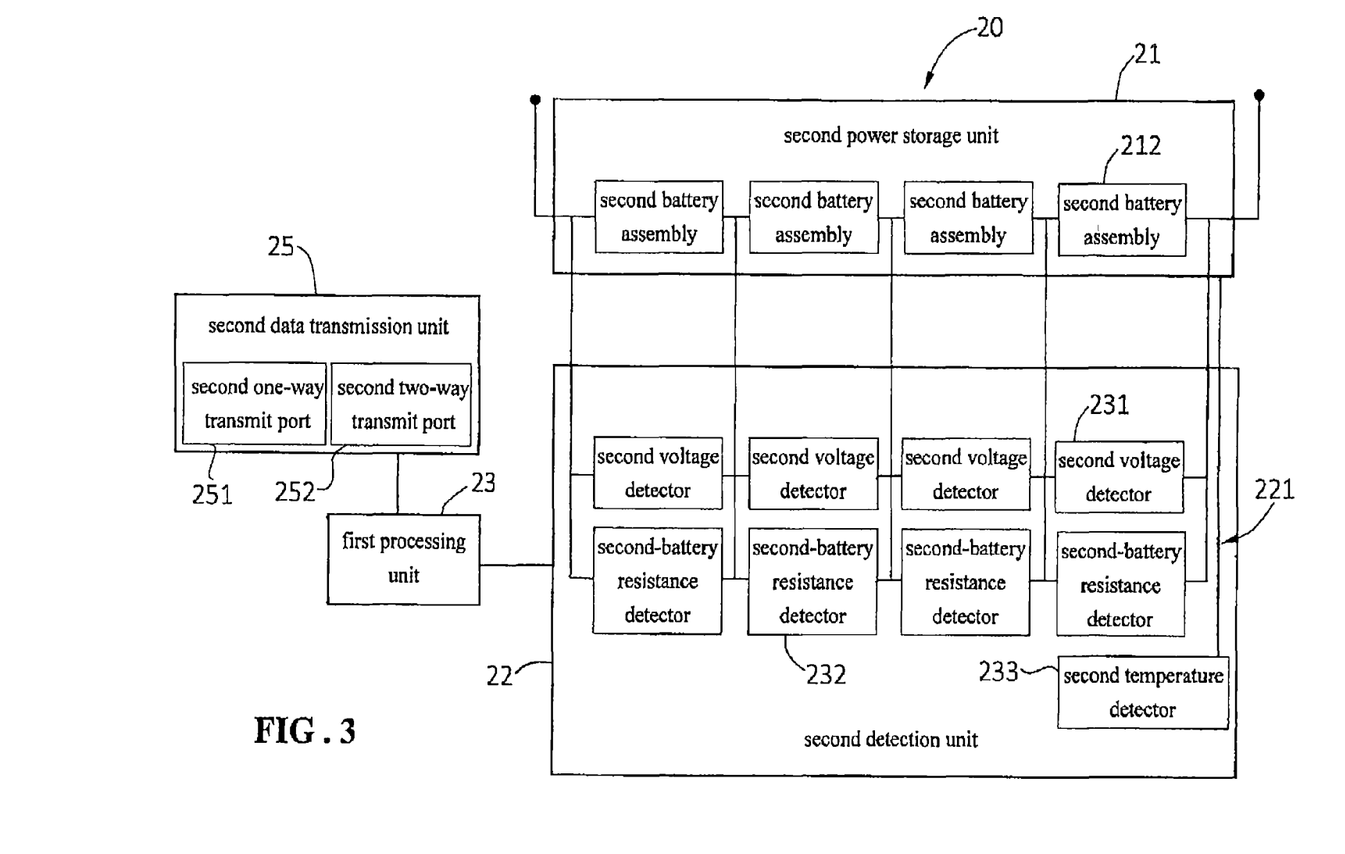
FIG. 3 is a circuit block diagram of the sub battery module according to the first embodiment of the present invention.

The sub battery module 20 includes a second power storage unit 21, a second detection unit 22, a second processing unit 23, and a second data transmission unit 25, wherein the second power storage unit 21 is coupled with the second detection unit 22, the second detection unit 22 is coupled with the second data transmission unit 25, and the second data transmission unit 25 is coupled with the second processing unit 23.

The second power storage unit 21 includes multiple second battery assemblies 212 which are connected in series, a respective second battery assembly 212 has at least one secondary battery configured to store and output electric energy, and the second power storage unit 21 allocates at least one third identification code in advance, the respective second battery assembly 212 has at least one fourth identification code allocated thereto, such that the at least one third and fourth identification codes of the second power storage unit 21 and the respective second battery assembly 212 are distinguished, wherein the respective second battery assembly 212 has multiple battery cores (not shown) which are connected in series.

The second detection unit 22 includes multiple second detectors 221, wherein a respective second detector 221 is configured to detect a second voltage value and a second resistance value of the respective second battery assembly 212 and a second temperature value of the second power storage unit 21, and the respective second detector 221 is configured to send the second voltage value, the second resistance value, and the second temperature value to the second processing unit 23. The multiple second detectors 221 are comprised of multiple second voltage detectors 231, multiple second-battery resistance detectors 232, and a second temperature detector 233, wherein a respective second voltage detector 231 is coupled with the respective second battery assembly 212 so as to detect the second voltage value of the respective second battery assemblies 212, a respective second-battery resistance detector 232 is coupled with the respective second battery assembly 212 so as to detect the second resistance value of the respective second battery assembly 212, and the second temperature detector 233 is coupled with the second power storage unit 21 so as to detect the second temperature value of the second power storage unit 21.

The second processing unit 23 is a microprocessor and is configured to bind the second voltage value and the second resistance value with a corresponding identification code of the respective second battery assembly 212, and the second processing unit 23 is configured to bind the second temperature value with a corresponding identification code of the second power storage unit 21, such that the second-battery data are processed and sent to the second data transmission unit 25. Thereby, the remote management module 300 judges the second-battery data and corresponds the second voltage value and the second resistance value to a specific second battery assembly 212, and the remote management module 300 corresponds the second temperature to the second power storage unit 21, thus distinguishing an operation status of the respective second battery assembly 212 and the second power storage unit 21.

The second data transmission unit 25 includes a second one-way transmit port 251 and a second two-way transmit port 252, wherein the first one-way transmit port 151 is connected with the second two-way transmit port 252 via the transmission wire 30 so that the sub battery module 20 sends the second-battery data to the main battery module 10 via the transmission wire 30.

Figure 1:
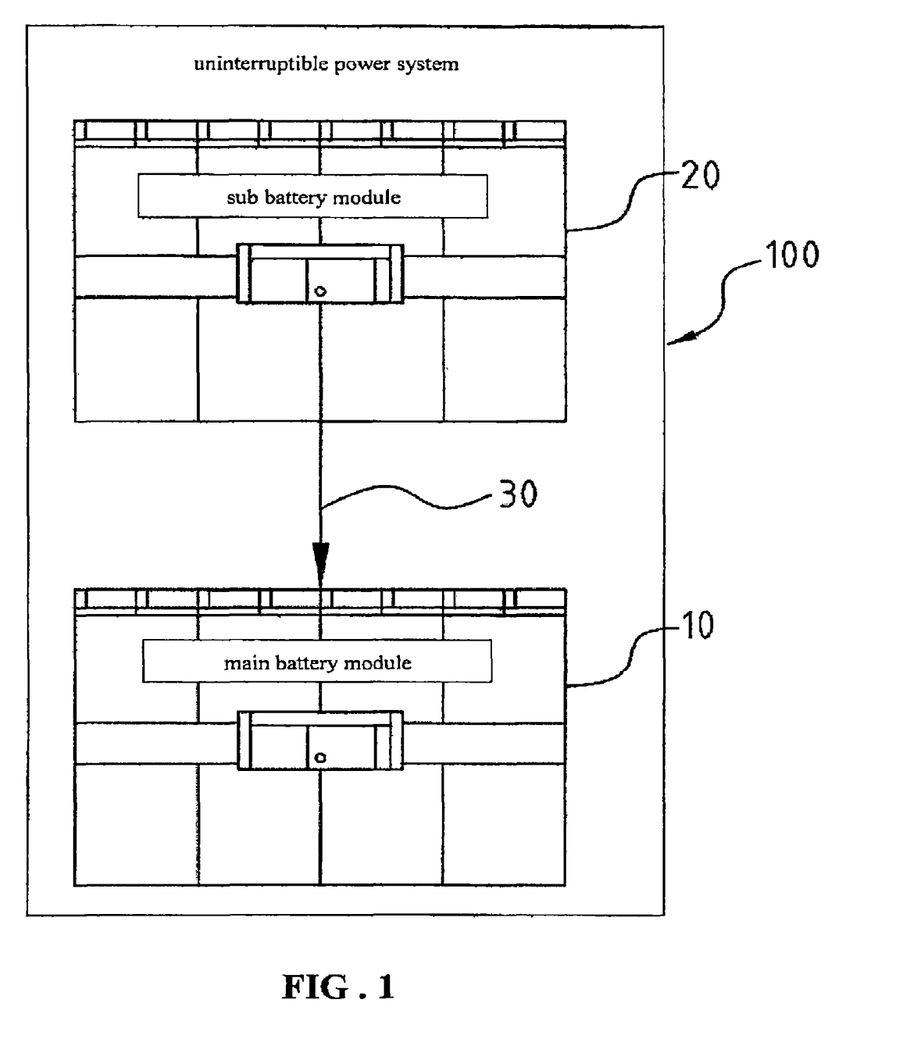
FIG. 1 is a schematic view showing the operation of a main battery module and a sub battery module of a device for detecting a secondary battery of an uninterruptible power system according to a first embodiment of the present invention.

Accordingly, the first detection units 11 detects the first power storage unit 11, the second detection unit 22 detects the second power storage unit 21, and the communication unit 14 sends the first-battery data and the second-battery date to the cloud server, thus reducing management and maintenance labor of the uninterruptible power system 100 in different positions and obtaining quick detection and monitoring. Preferably, the first-battery data and the second-battery data are acquired from the cloud server remotely.

The device of detecting uninterruptible power system 100 further comprises a test bar (not shown) which is a Bluetooth transmitter, such that when testing and maintaining the main battery module 10 or the sub battery module 20, the test bar 10 is connected with the first two-way transmit port 152 or the second two-way transmit port 252 so as to read the first-battery data or the second-battery data by way of communication equipment (such as the smart phone) having an application program, thus enhancing testing and maintaining reliability.

Figure 5:
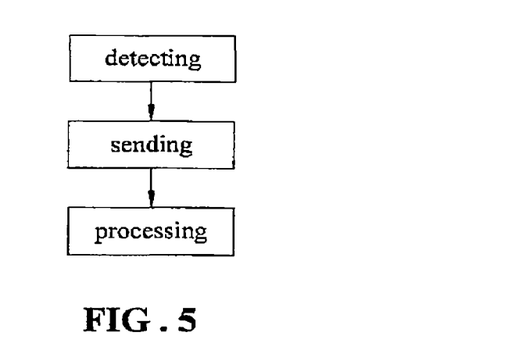
FIG. 5 is a flow chart of a method for detecting the secondary battery of the uninterruptible power system according to the first embodiment of the present invention.

Referring to FIG. 5, a method of detecting the secondary battery of the uninterruptible power system 100 is executed by using the cloud server 200, the remote management module 300, and the device of detecting the secondary battery of the uninterruptible power system 100, wherein the device of detecting the secondary battery of the uninterruptible power system 100 comprises the uninterruptible power system 100, the cloud server 200 and the remote management module 300 having a network and are configured to send and receive data remotely. The method of detecting the secondary battery of the uninterruptible power system 100 comprises steps of:

detecting, wherein the uninterruptible power system 100 detects the first power storage unit 11 of the main battery module 10 and the second power storage unit 21 of the sub battery module 20 so as to obtain the first-battery data and the second-battery data based on detecting result;

sending, wherein the uninterruptible power system 100 sends the first-battery data and the second-battery data to the cloud server 200, and the remote management module 300 acquires the first-battery data and the second-battery data regularly, such that equipment manager or repairer operates the remote management module 300 to acquire the first-battery data and the second-battery data from the cloud server 200; and proceeding, wherein the remote management module 300 compares the first-battery data and the second-battery data with a preset safety value so as to display the operation status of the first power storage unit 11 and the second power storage unit 21 according to a comparison result of the first-battery data, the second-battery data and the preset safety value, thus deciding and executing maintenance of the uninterruptible power system 100 quickly.

When the uninterruptible power system 100 is tested and repaired, the test bar is connected with the first two-way transmit port 152 or the second two-way transmit port 252 so as to read the first-battery data or the second-battery data and to confirm maintenance and replacement of the respective first battery assembly 112 and the respective second battery assembly 212, thus enhancing testing and maintaining reliability.

Figure 4:
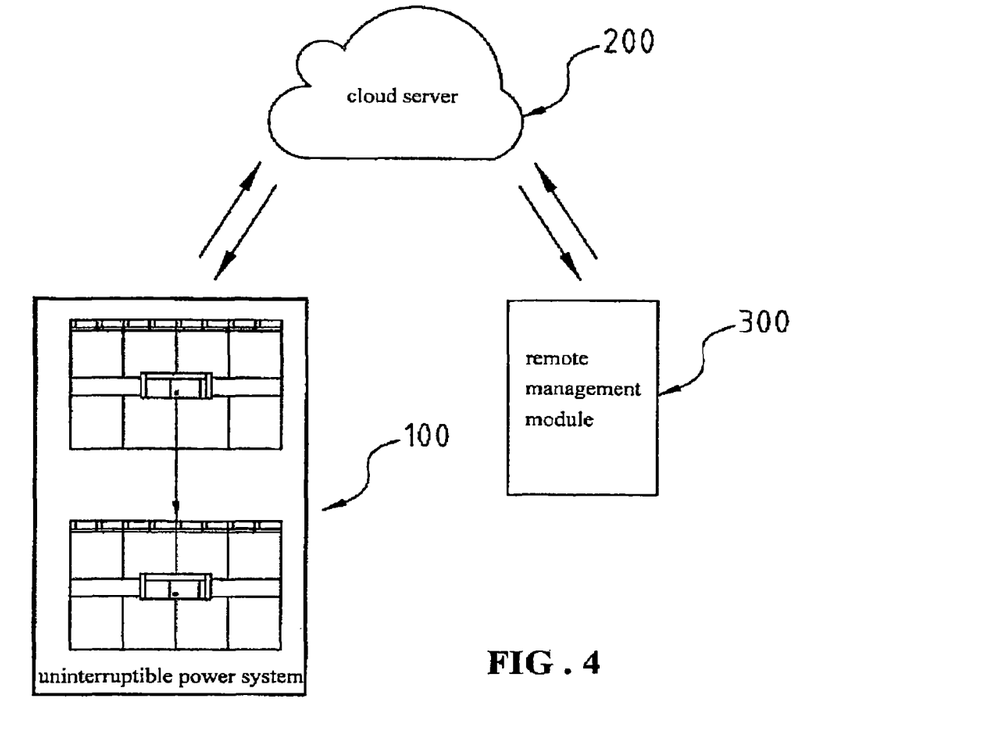
FIG. 4 is a schematic view showing the operation of a cloud server, a management module and the uninterruptible power system according to the first embodiment of the present invention.

When the uninterruptible power system 100 is broken, maintenance staff acquires the first-battery data and the second-battery data from the cloud server 200 by using the smart phone to confirm a position of the uninterruptible power system 100 quickly and accurately, thus maintaining the uninterruptible power system 100 easily.

Figure 6:
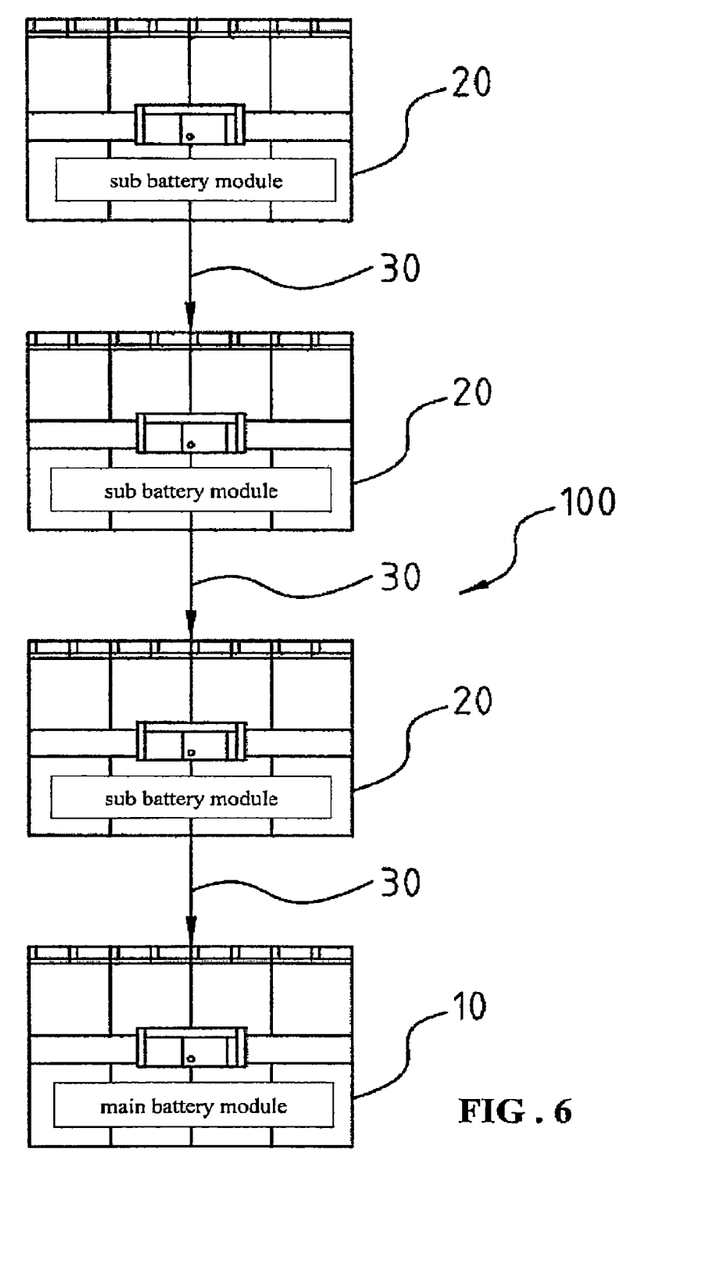
FIG. 6 is a schematic view showing the operation of a main battery module and a sub battery module of a device for detecting a secondary battery of an uninterruptible power system according to a second embodiment of the present invention.

As illustrated in FIG. 6, a difference of a device for detecting a secondary battery of an uninterruptible power system 100 from that of the first embodiment comprises: multiple sub battery modules 20 and multiple transmission wires 30, wherein a respective sub battery module 20 is connected with a respective transmission wire 20 so as to send the second-battery data to the main battery module 10.

The multiple sub battery modules 20 are configured to increase power storage and supply of the uninterruptible power system 100.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A device for detecting a secondary battery of an uninterruptible power system comprising: a main battery module (10) and at least one sub battery module;

wherein the main battery module is coupled with the at least one sub battery module so that the at least one sub battery module sends second-battery data of the at least one sub battery module to the main battery module, and the main battery module sends the second-battery data and first-battery data of the main battery module to a cloud server, such that a remote management module detects the main battery module and the at least one sub battery module remotely;

wherein the main battery module includes a first power storage unit, a first detection unit, a first processing unit, a communication unit, and a first data transmission unit, wherein the first power storage unit is coupled with the first detection unit, the first detection unit, the communication unit and the first data transmission unit are coupled with the first processing unit, wherein the first data transmission unit is coupled with the communication unit;

wherein the first power storage unit includes multiple first battery assemblies which are connected in series, and a respective first battery assembly has at least one secondary battery configured to store and output electric energy;

wherein the first detection unit includes multiple first detectors, and a respective first detector is configured to detect a first voltage value and a first resistance value of the respective first battery assembly and a first temperature value of the first power storage unit, and the respective first detector is configured to send the first voltage value, the first resistance value, and the first temperature value to the first processing unit;

wherein the first processing unit is a microprocessor and is configured to bind the first voltage value and the first resistance value with a corresponding identification code of the respective first battery assembly, and the first processing unit is configured to bind the first temperature value with a corresponding identification code of the first power storage unit, such that the first-battery data are processed and sent to the communication unit;

wherein the communication unit is a wireless communicator configured to send the first-battery data to the cloud server;

wherein the first data transmission unit includes a first one-way transmit port and a first two-way transmit port;

wherein the sub battery module includes a second power storage unit, a second detection unit, a second processing unit, and a second data transmission unit, wherein the second power storage unit is coupled with the second detection unit, the second detection unit is coupled with the second data transmission unit, and the second data transmission unit is coupled with the second processing unit;

wherein the second power storage unit includes multiple second battery assemblies which are connected in series, and a respective second battery assembly has at least one secondary battery configured to store and output electric energy;

wherein the second detection unit includes multiple second detectors, a respective second detector is configured to detect a second voltage value and a second resistance value of the respective second battery assembly and a second temperature value of the second power storage unit, and the respective second detector is configured to send the second voltage value, the second resistance value, and the second temperature value to the second processing unit;

wherein the second processing unit is a microprocessor and is configured to bind the second voltage value and the second resistance value with a corresponding identification code of the respective second battery assembly, and the second processing unit is configured to bind the second temperature value with a corresponding identification code of the second power storage unit, such that the second-battery data are processed and sent to the second communication unit; and wherein the first one-way transmit port is connected with the second two-way transmit port via a transmission wire so that the sub battery module sends the second-battery data to the main battery module via the transmission wire.

2. The device for detecting the secondary battery as claimed in claim 1, wherein the communication unit is at least one of a Narrowband Internet of Thing (NB-IoT) communicator, a 4G wireless communicator, and a 5G wireless communicator.

3. The device for detecting the secondary battery as claimed in claim 1 further comprising a test bar which is a Bluetooth transmitter, such that when testing and maintaining the main battery module or the sub battery module, the test bar is connected with the first two-way transmit port or the second two-way transmit port so as to read the first-battery data or the second-battery data by way of communication equipment having an application program.

4. The device for detecting the secondary battery as claimed in claim 1 further comprises multiple sub battery modules and multiple transmission wires, wherein a respective sub battery module is connected with a respective transmission wire so as to send the second-battery data to the main battery module.

5. The device for detecting the secondary battery as claimed in claim 1, wherein the multiple first detectors are comprised of multiple first voltage detectors, multiple first-battery resistance detectors, and a first temperature detector, wherein a respective first voltage detector is coupled with the respective first battery assembly so as to detect the first voltage value of the respective first battery assemblies, a respective first-battery resistance detector is coupled with the respective first battery assembly so as to detect the first resistance value of the respective first battery assembly, and the first temperature detector is coupled with the first power storage unit so as to detect the first temperature value of the first power storage unit.

6. The device for detecting the secondary battery as claimed in claim 1, wherein the multiple second detectors are comprised of multiple second voltage detectors, multiple second-battery resistance detectors, and a second temperature detector, wherein a respective second voltage detector is coupled with the respective second battery assembly so as to detect the second voltage value of the respective second battery assemblies, a respective second-battery resistance detector is coupled with the respective second battery assembly so as to detect the second resistance value of the respective second battery assembly, and the second temperature detector is coupled with the second power storage unit so as to detect the second temperature value of the second power storage unit.

7. The device for detecting the secondary battery as claimed in claim 1, wherein the respective first battery assembly and the respective second battery assembly have multiple battery cores which are connected in series.

8. A method of detecting the secondary battery of the uninterruptible power system being executed by using the cloud server, the remote management module, and the device of detecting the secondary battery of the uninterruptible power system of claim 1, wherein the device of detecting the secondary battery of the uninterruptible power system comprises the uninterruptible power system, the cloud server and the remote management module having a network and configured to send and receive data remotely, the method of detecting the secondary battery of the uninterruptible power system comprises steps of:

detecting, wherein the uninterruptible power system detects the first power storage unit of the main battery module and the second power storage unit of the sub battery module so as to obtain the first-battery data and the second-battery data based on detecting result;

sending, wherein the uninterruptible power system sends the first-battery data and the second-battery data to the cloud server, and the remote management module acquires the first-battery data and the second-battery data regularly, such that equipment manager or repairer operates the remote management module to acquire the first-battery data and the second-battery data from the cloud server; and     proceeding, wherein the remote management module compares the first-battery data and the second-battery data with a preset safety value so as to display the operation status of the first power storage unit and the second power storage unit.

\* \* \* \* \*